United States Patent
Chung-Maloney et al.

(10) Patent No.: US 7,194,707 B2
(45) Date of Patent: Mar. 20, 2007

(54) METHOD AND APPARATUS FOR DEPOPULATING PERIPHERAL INPUT/OUTPUT CELLS

(75) Inventors: Wai Ling Chung-Maloney, Waterbury Center, VT (US); Douglas W. Stout, Milton, VT (US); Steven J. Urish, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 10/711,431

(22) Filed: Sep. 17, 2004

(65) Prior Publication Data

US 2006/0064660 A1    Mar. 23, 2006

(51) Int. Cl.
*G06F 17/50* (2006.01)
(52) U.S. Cl. ............................................. 716/4; 716/12
(58) Field of Classification Search .................... 716/1, 716/2, 4, 11, 12
See application file for complete search history.

(56) References Cited

U.S. PATENT DOCUMENTS

| 3,879,839 | A | 4/1975 | Logue |
| 3,984,860 | A | 10/1976 | Logue |
| 5,255,228 | A | 10/1993 | Hatta et al. |
| 5,577,050 | A | 11/1996 | Bair et al. |
| 5,807,791 | A | 9/1998 | Bertin et al. |
| 6,046,897 | A | 4/2000 | Smith et al. |
| 6,119,049 | A | 9/2000 | Peddle |
| 6,426,556 | B1 | 7/2002 | Lin |
| 6,463,576 | B1 | 10/2002 | Tomoda |
| 6,550,047 | B1 | 4/2003 | Becker |
| 6,662,352 | B2 | 12/2003 | Nsame et al. |
| 6,836,026 | B1 * | 12/2004 | Ali et al. ..................... 257/786 |

FOREIGN PATENT DOCUMENTS

JP        2004-55902        2/2004

\* cited by examiner

*Primary Examiner*—Thuan Do
(74) *Attorney, Agent, or Firm*—Whitham, Curtis, Christofferson & Cook, PC; Richard M. Kotulak

(57) ABSTRACT

Chip area corresponding to unnecessary I/O cell sites is recovered and made usable for additional core cells and power connections by grouping I/O cells into I/O kernels of contiguous I/O cells having power connections independent of other I/O kernels and depopulating I/O cell sites in accordance with areas corresponding to I/O kernels. Since I/O kernels have dedicated power connections, no power busses are present in the depopulated I/O cell sites which can then be freely use for additional core cells, power connections or the like. This technique also allows selection of a chip of minimum required area to be determined prior to design of chip layout.

14 Claims, 11 Drawing Sheets

| Chip Image | 4.85 mm x 4.85 mm | 5.58 mm x 5.58 mm | 6.30 mm x 6.30 mm |
|---|---|---|---|
| Core Cell Area (dimensions) | 3.89 mm x 3.89 mm | 4.62 mm x 4.62 mm | 5.34 mm x 5.34 mm |
| Core Cell Area | 15.13 mm$^2$ | 21.34 mm$^2$ | 28.62 mm$^2$ |
| Total Usable IO cell sites | 352 | 416 | 480 |
| # of edge kernel (per side) | 8 | 10 | 12 |
| # of corner kernel (per corner) | 1 | 1 | 1 |

| | |
|---|---|
| Usable IO Sites per Edge Kernel | 8 |
| Core Area Recovered by replacing an edge kernel | 0.36 mm$^2$ |
| Usable IO Sites per Corner Kernel | 24 |
| Core Area Recovered by replacing a corner kernel | 1.0 mm$^2$ |

*Figure 10*

METHOD AND APPARATUS FOR DEPOPULATING PERIPHERAL INPUT/OUTPUT CELLS

BACKGROUND OF INVENTION

1. Field of the Invention

The present invention generally relates to the design and manufacture of integrated circuits such as application specific integrated circuits (ASICs) and, more specifically, to efficient usage of chip space allocated to logic cells and input/output (I/O) cells thereof.

2. Description of the Prior Art

The use of digital data processing has become ubiquitous, particularly for control and data gathering functions. Many common commercial products now include at least one if not dozens of digital processors for control of at least some operations or operating conditions thereof. In other cases, collected raw data must be processed using a complex computation in order to be of use. Many circumstances are thus presented in which some particular digital processing algorithms must be rapidly performed repeatedly and to the exclusion of a general capability for performance of arbitrary algorithms. Additionally, processing speed requirements may exceed that which is available from general purpose processing circuits which are commercially available.

In such a case, or for reasons of physical (e.g. size, weight or power consumption) constraints, it is usually necessary to design and fabricate one or more application specific integrated circuits (ASICs) which may be of limited processing capability compared to general purpose processors but which may be optimized to provide the particular functions needed. In general, the design and fabrication of integrated circuits is prohibitively expensive unless the quantity of identical circuits which can be commercially marketed is very large, often one million or more, to allow the design cost to be distributed over a large number of chips. Therefore, to support the design of ASICs which are typically produced in less than commercial quantities (e.g. ten thousand or, sometimes, much less), some design techniques and standardized portions of chip designs such as chip sizes and power and signal input and output layouts, collectively referred to as a chip image, have been developed to reduce the amount of design and layout effort required for a new ASIC design. All such design portions must be fully documented to insure compatibility with other features of the design.

Even at a more basic level, ASIC designs are usually carried out using standardized cells. A cell, as the term is used herein, is an electronic element of pattern therefor such as a transistor or capacitor or an elemental logic circuit such as an inverter, driver, power converter or transmission or logic gate which can be repeated as necessary in combination with other cells to build up a circuit design corresponding to the desired function. These cell designs must also be fully documented.

In practice, some groups of cells are often used together and the same group of cells may be used in different configurations depending on placement on a chip and referred to by either the function (e.g. logic, power, I/O, etc.) or placement (e.g. edge, corner etc.) of the group of cells. Thus the group of cells may be repeated a number of times on a chip and used as a group in different ASIC designs in much the same manner as individual cells for convenience in design development. Such a group of cells may also be referred to as a cell and may, like simpler or more elemental cells, be further identified by placement and/or function. In general, I/O cells are placed around the periphery of chips with connection pads forming a so-called pad collar.

The documentation of images and other standardized features which may be included in a given design is, itself, costly but justified in supporting the ability to design ASICs at an acceptable cost. In particular, this relatively massive amount of information, often referred to as libraries, can be rapidly and automatically accessed by computers to rapidly develop chip layouts and manufacturing mask patterns with very limited operator intervention. A library must be established for each technology (e.g. bipolar transistors, CMOS, and the like and each type of perfecting feature employed therewith, each minimum feature size regime, each function of respective cell types, each size and shape of chip, each package design and so on) used in integrated circuit designs.

However, such processing to create a new chip design is optimally effective only to the extent that the design is constrained to use of standardized design features and previously designed cells. The resulting design is not optimized to produce the design using the smallest possible chip size. Since costs of manufacture depend on the number of chips which can be formed on a single wafer on which a sequence of processing steps are performed using very expensive tools (e.g. lithographic exposure tools, plasma reactors, annealing chambers and the like) chip size may have a major impact on overall production costs of ASICs, notwithstanding the economies which may have been achieved in design using standardized documentation libraries.

Such an impact is particularly evident since many wirebond ASIC chips are not I/O (input/output) limited. That is, the image/package can support more I/Os (e.g. I/O cells) than the design requires while the internal core logic of the design dictates the chip/package size. I/O sites on the image are typically occupied by I/O cells and the unused I/O sites are essentially wasted chip space. Moreover, I/O cells tend to be very large compared to logic cells or other types of cells and, depending on the number of unused I/O sites, this wasted space can be a significant proportion of the area of the die or chip.

Since the cost to make a die is proportional to the area of the die (e.g. limiting the number of dies which can be fabricated on a wafer of a given size using a given number of wafer processing steps), it is desirable to make the die as small as possible by adjusting the I/O site layout even though such an adjustment is a departure from standardized design features. Two alternative techniques for performing such an adjustment are currently known and both involve adjustment of I/O pitch and wirebond pad pitch.

A first technique for adjustment of I/O cell layout starts with a staggered wirebond pad pattern of a standard image and removes one of the rows of wirebond pads and relaxing (e.g. substantially doubling) the pitch of wirebond pads. When used with the same I/O cell library with the same aspect ratio as in the standard image, the result is that fewer (often about half) of the I/O sites are bonded out from the chip to the package.

A second technique is to change the I/O cell aspect ratio, and change the wirebond pad pitch accordingly, to produce either a staggered or in-line pad collar on the chip. This approach reclaims more chip space than the first technique described above but requires costly development and maintenance of additional I/O cell libraries (e.g. for each different I/O cell aspect ratio) for each I/O cell to wirebond pad pitch relationship.

While these techniques can potentially reclaim some space on a chip which would be otherwise wasted and could potentially allow a smaller chip size to be employed, the possibility of using a smaller chip may not become evident until a particular design is relatively advanced after expenditure of substantial design time and expense. Further, use of an optimally small chip is not guaranteed. At the present state of the art, no process is known which can optimize the chip size of a design based on the number of I/O cells required by the design.

SUMMARY OF INVENTION

It is therefore an object of the present invention to provide a technique of optimizing chip size for integrated circuit designs which are not I/O limited.

It is another object of the invention to provide chips in which unusable chip space is minimized.

In order to accomplish these and other objects of the invention, a method for developing a design of an integrated circuit is provided comprising steps of selecting a smallest chip image from among a plurality of chip images that can supply at least the required number of I/O cells, determining a number of excess I/O kernels of the smallest chip image in excess of the required number of I/O cells, computing a number of other cells types which can be provided by the core area of the image and the area of the excess I/O kernels, and evaluating whether or not a required number of cells for the integrated circuit design can be provided within the smallest chip image if the excess I/O cells or I/O kernels are depopulated from the smallest chip image.

In accordance with another aspect of the invention, an integrated circuit is provided including an array of I/O kernels, each I/O kernel having a plurality of contiguous I/O cells having common power connections, independent of any other I/O kernel, and a plurality of contiguous depopulated I/O cell sites corresponding to an area of an I/O kernel and having core cells formed therein.

In accordance with a further aspect of the invention, an integrated circuit having peripheral connections pads is provided including I/O cells associated with a contiguous plurality of connection pads and a plurality of contiguous depopulated I/O cell sites associated with a contiguous plurality of other connection pads, and power connections to the other connection pads and logic cells located in the depopulated I/O cell sites.

BRIEF DESCRIPTION OF DRAWINGS

The foregoing and other objects, aspects and advantages will be better understood from the following detailed description of a preferred embodiment of the invention with reference to the drawings, in which:

FIG. 10 is an exemplary image/package data matrix useful in performing a method in accordance with the invention.

DETAILED DESCRIPTION

Figure 1:
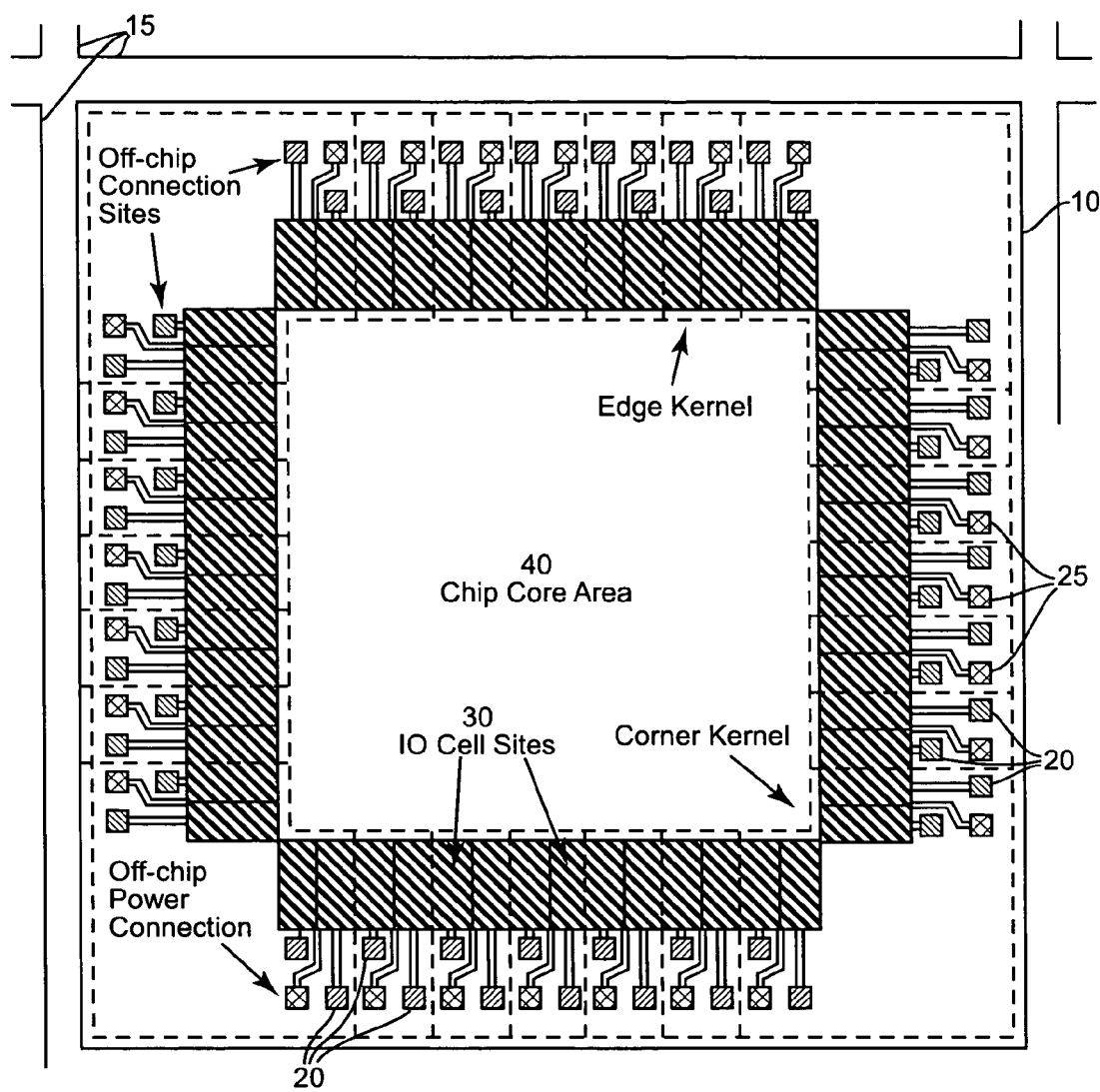
FIG. 1 is a plan view of a standardized chip image.
Figure 2:
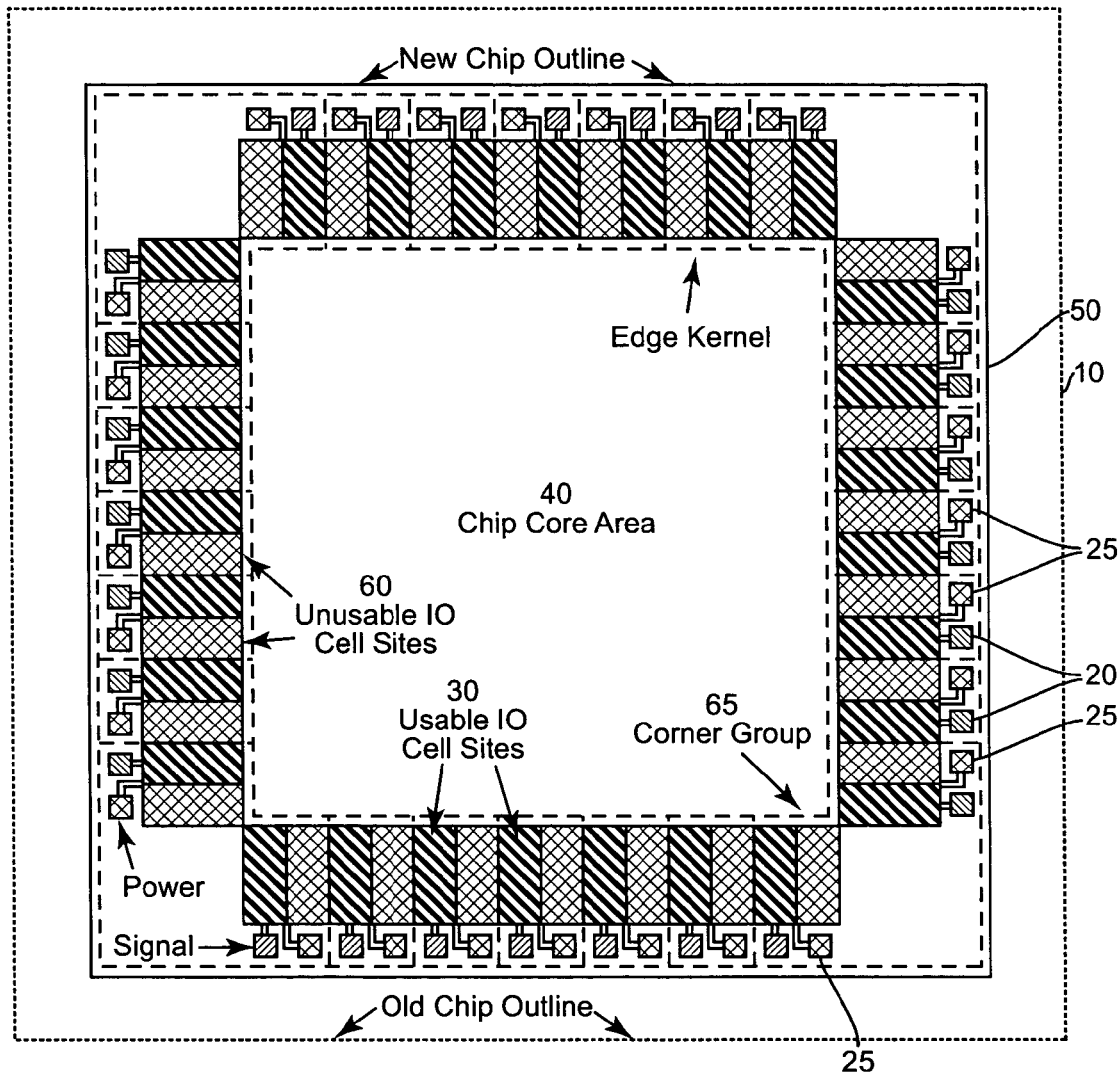
FIGS. 2 and 3 are plan views of modifications of the standardized chip image of FIG. 1.
Figure 3:
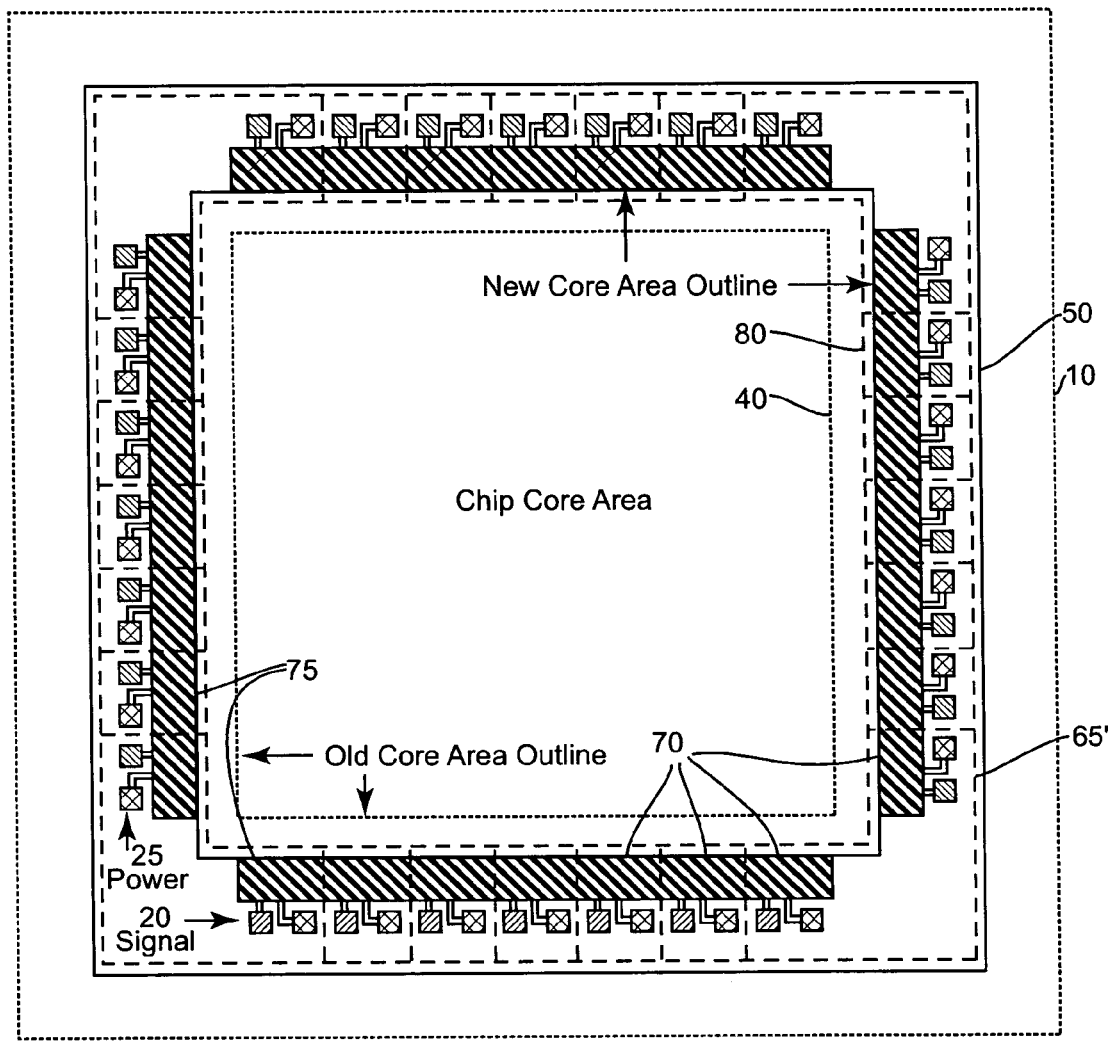

Referring now to the drawings, and more particularly to FIG. 1, there is shown a plan view of an exemplary chip image having features of standardized chip images useful for explaining the problem addressed by the invention but not necessarily conventional or corresponding to any known design. It should be understood that FIGS. 1–3, are arranged to facilitate an understanding of the invention and no portion of any of FIGS. 1–3 is admitted to be prior art as to the present invention. However, since these Figures do not include the invention (or the results of the method of the invention, FIGS. 1–3 have been designated as "related art".

It will be helpful to an understanding of the nature and scope of the invention from the following description if some definitions of terminology are kept in mind: package is meant to refer to the housing and/or interface between the chip and circuit board; off-chip connection refers to a wirebond pad, C4 bump and the like used to connect the chip to the package (wirebond pad and C4 may sometimes be used synonymously therewith and are intended to encompass all other off-chip connection structures unless the context indicates otherwise); off-chip connection site refers to a potential chip location of an off-chip connection; core cell refers to internal circuits and elements (e.g. digital logic, analog functions, macros and the like) which do not make direct connections off-chip; core cell area refers to the region in which core cells may be placed; I/O cell refers to driver and/or receiver circuitry used to communicate between core cells of the chip and the off-chip connections; I/O cell site or I/O slot refers to locations on a chip in which an I/O cell may be placed under the design rules for the chip; kernel refers to a sub-set of the image generally containing two or more I/O cell sites and their respective off-chip connection(s) and having power connections independent of other kernels and I/O sites and power busses therefor; corner kernel refers to a kernel placed in the corner of an image and having a shape generally in the shape of an "L"; edge kernel refers to a kernel that resides only along one edge of an image, size varying with the number of I/O cells therein; filler kernel refers to a kernel used to replace an edge or corner kernel during I/O cell depopulation in accordance with the invention and converts all I/O sites and all or some of the off-chip connections in the replaced kernel to core cell area while other off-chip connections, if any, may be used for power connections tied directly to the internal power grid of the chip.

The chip image of FIG. 1 features an outer boundary 10 which corresponds to the overall size of the finished chip. An array of such images is normally laid out on a wafer spaced from each other by a distance substantially equal to the kerf which will be removed when the wafer is diced into individual chips, as indicated by lines 15. In order to accommodate the maximum functionality likely to be included in a given chip design, the border of the chip is populated with, for example, two rows of I/O connection sites such as exemplary wirebond pads 20. Other types of connection structures can also be used such as structures which accommodate so-called C4 solder preform structures ("bumps"). Power connections may be made in corners or elsewhere on the chip. However, it should be noted that there is a current trend toward increasing the number of power connections due, in part, to the use of reduced power supply voltages and the use of circuits operating at different voltages to maximize performance and functionality while reducing power consumption and dissipation. In any case, power connections must be provided on the chip and, since an off-chip connection pad structure must be provided for each power connection, will consume a significant amount of space and present layout complications. Power connections are generally made in one of two ways: bringing in power through I/O cells or other programmed points, or direct connections through bond pads such as give rise to kernels, as defined above.

Each of these connection sites 20 is connected to a corresponding I/O cell site 30. Each I/O cell site generally includes an amplifier/driver circuit and some switching to reliably communicate digital signals on and off the chip without engendering electrical noise in the signal as well as power busses for the I/O cells. For this reason, the I/O cells are generally larger than logic cells that may be used in the chip design. By the same token, I/O cell sites cannot generally be used for other types of cells when an I/O cell is not needed due to the presence of the power busses to supply power to other I/O cells along a side/edge or corner of a chip. (Note that in FIG. 1, a signal pad 20 is provided for each I/O cell but that substantially fewer Power connection pads 25 are provided; possibly as few as two pads per edge or per chip and necessitating power busses along the array of I/O cell sites.) That is, the I/O cell sites are usually provided in a linear array at substantially the same effective pitch as the staggered array of connections 20 and having a length which is as long as can be accommodated in forming a ring or frame on the chip and numerous I/O cell sites are powered in common over power busses running generally parallel to the chip edge through the I/O cell site area thus precluding other types of cells from being substituted for I/O cells in the I/O cell site area. The remainder to the chip image, referred to as the chip core area, may be allocated at will to cells of other types such as logic cells.

Referring now to FIG. 2, the first method alluded to above for avoiding wasted chip area corresponding to unused I/O cell sites in integrated circuits which are not I/O limited will be described. In accordance with this methodology, the chip size is reduced (e.g. from chip edge 10 of FIG. 1, shown using a dotted line in FIG. 2) by removal of one of the rows of wirebond pads 20 to result in a new chip outline/area 50. Doing so results in approximately one-half of the I/O cell sites remaining usable while the remaining I/O cell sites 60 become unusable since no off-chip connection can then be made and, while I/O cells are generally larger than other types of cells such as logic cells, integral numbers of such other types of cells will seldom fit into the space of I/O cells without unused space remaining and, moreover, the boundaries of unused I/O cells present complicated layout constraints, particularly for interconnect wiring. Note also that power connection pad sites remain fewer than the total number of I/O cell sites (30, 60) but, although now equal to the number of usable I/O cell sites, or substantially so, two power connections are needed for an I/O cell and the use of busses through both usable and unusable I/O cell sites remains required, further precluding the substitution of other types of cells in the areas of the unusable I/O cell sites. The chip core area 40 remains the same as in FIG. 1 while the reduction in chip dimensions may allow more chips to be formed on a wafer with a given amount of processing. Therefore, some economies may be derived from this technique although the amount of unusable chip space remains substantial.

A concept exploited by the invention may also be described in connection with FIG. 2. Specifically, it will be noted that the two pairs of I/O cell sites 30, 60 at the corners of the chip (or ends of the row of I/O cell sites along each edge of the chip) provide two power connections which are sufficient to provide power to these I/O cell sites as a group, as indicated by 65 (indicated by dashed lines) even though power busses would be required. However, since one I/O cell site of each pair is unusable under this particular technique due to both the power busses and the inability to provide signal connection pads 20 and is thus highly inefficient, the invention will use a similar arrangement as a corner kernel which, while different from FIG. 2 as will be described below, may be best understood from comparison with corner group 65' of FIG. 3. Such a comparison may also be helpful in understanding the concept of a kernel, in general.

Referring now to FIG. 3, the second technique for reducing chip size and unused chip space in integrated circuits which are not I/O limited will be discussed. As with the technique described above with reference to FIG. 2, one of the staggered rows of the array of connection sites 20 has been eliminated, allowing the chip size to be reduced from boundary 10, as shown in FIG. 1, to boundary 50, as shown in FIG. 2. Approximately one-half of the I/O cells have also been eliminated as in the technique described above. However, in this case, the aspect ratio of the remaining usable I/O cells has been changed as indicated by reference numeral 70 to eliminate unusable I/O cell sites 60 (FIG. 2) to form a more or less continuous array of I/O cell sites and reduce incursion of the I/O cells toward the center of the chip. By doing so, the core area boundary 40, as shown in FIGS. 1 and 2 is expanded from boundary 40 to boundary 80.

This expansion of the core area potentially allows more cells of other than I/O type to be included in the design or a smaller chip to be used or some combination of the two, at least to the extent that the layout of I/O cell arrays 75 do not interfere with each other (e.g. since, without chip size reduction, the arrays 75 are possibly separated near the corners of the chip in accordance with the change of aspect ratio whereas the arrays were contiguous in FIGS. 1 and 2). However, any possible reduction of chip size cannot be recognized until the layout of the core area is substantially complete and there is no previously known technique for optimization of chip size. Further, while the technique of FIG. 3 provides some clear advantages in regard to that of FIG. 2, those advantages are achieved at a substantial cost of having libraries of I/O cells of differing aspect ratios to support differing numbers of depopulated I/O cells.

Moreover, it should be appreciated that not all reductions in chip size will result in reduced manufacturing costs since such reductions in manufacturing cost cannot be realized without reducing chip size sufficiently to increase the number of chips which can be placed on a wafer. Smaller potential chip size reduction than is sufficient to increase the number of chips which can be arrayed on a wafer should generally not be used since unnecessary problems such as increased criticality of layout, particularly for interconnect wiring, increased criticality of heat dissipation and the like may be encountered with no compensating potential benefit in manufacturing economy. Therefore, standardized chip sizes and shapes should be used; among which the smallest chip which can accommodate the needed cells of the chip design will be optimal.

Figure 4:
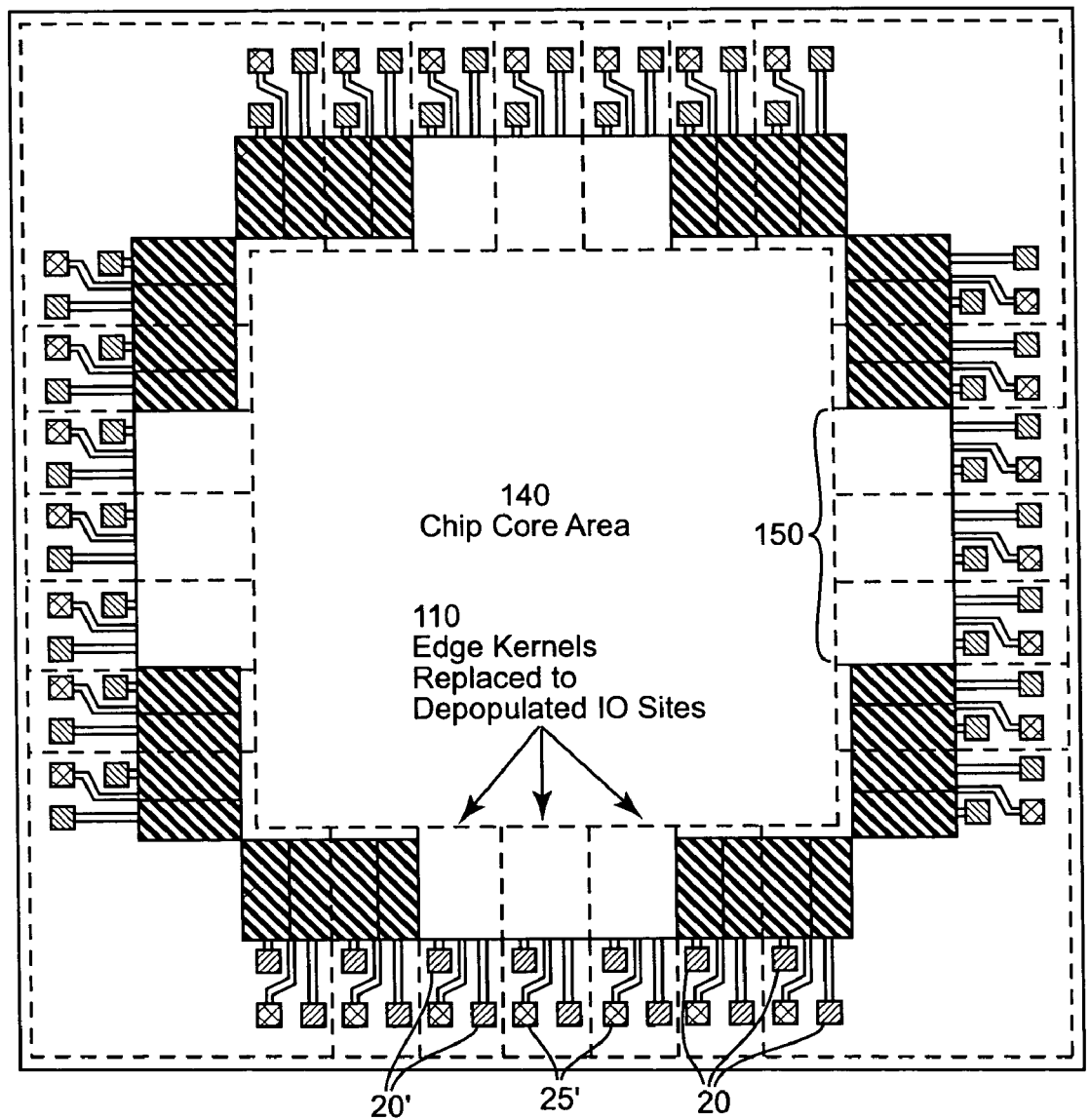
FIG. 4 is a plan view of a modified standardized chip image illustrating the concept of the invention.

Referring now to FIG. 4, the basic principles of the present invention will be explained. It will be appreciated from a comparison of FIG. 4 with FIG. 1, discussed above, that the image layouts are substantially the same: including a double-row staggered connection pad array and arrays of contiguous I/O cell sites around the chip periphery and adjacent the connection pad array. The difference between FIG. 4 and FIG. 1 is that an arbitrary number of contiguous I/O cell sites have been depopulated from the chip image on each side of the chip leaving kernels of contiguous I/O cells (as distinct from alternating individual I/O cell sites as in FIG. 2) and having sufficient power connection pad sites that busses are unnecessary and are omitted between the kernels. In the particular case illustrated in FIG. 4, approximately the same number (e.g. six per chip side) of I/O cell sites have been removed as have been removed in FIG. 2 for comparison.

It will be appreciated by those skilled in the art that a relatively larger continuous area presenting much less complicated layout constraints than result from the technique of FIG. 2 is thus provided and effectively results in an increased chip core area 140. Further, wirebond pads 20', 25' which correspond to removed/depopulated I/O cell sites may now be accessed from the chip core area (where no I/O cell sites or power busses intervene) and thus may be converted to power connections including power pads rather than requiring power connection pads and cells in the chip core area 140. As a consequence, there with be little degradation of wireability of cells in the additional core area developed and less concern over difficulty of placement and wireability of core cells.

Figure 5:
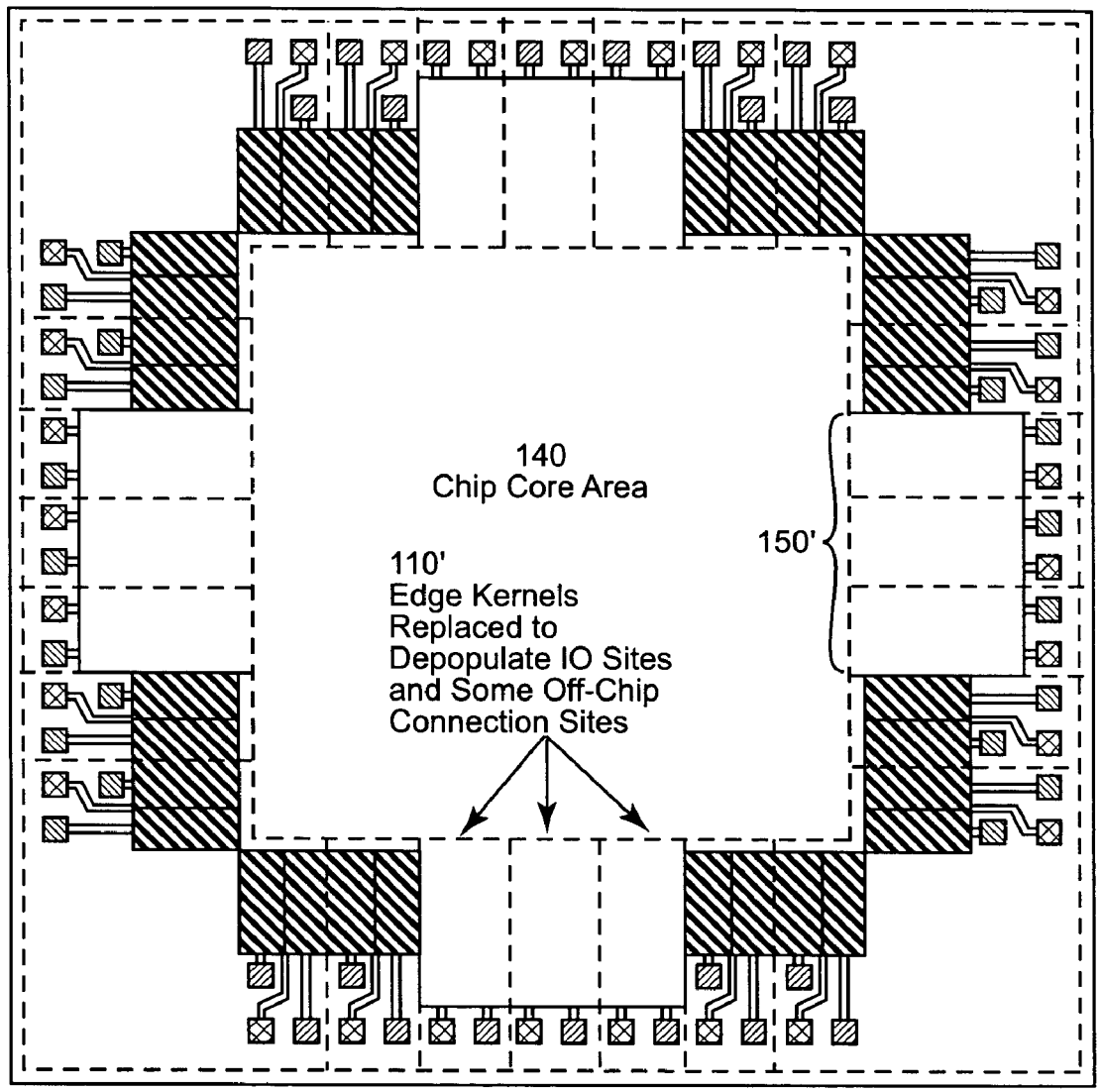
FIGS. 5, 5A, 6 and 7 are plan views of a chip image illustrating exemplary variant forms of the invention.
Figure 5A:
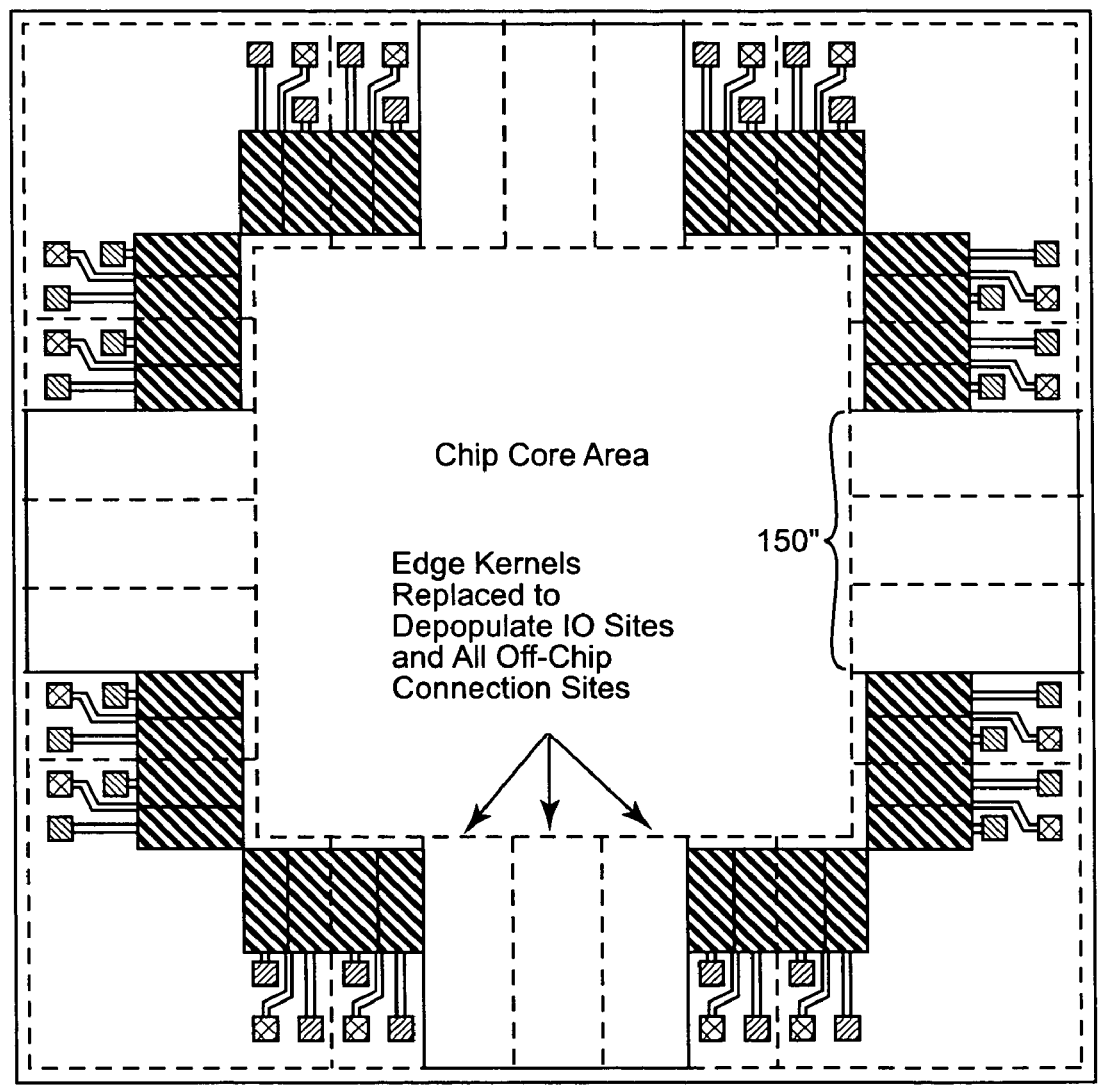

A variant form of an image for a chip generally in accordance with FIG. 4 is shown in FIG. 5. In this particular modification, some off-chip connection sites associated with depopulated I/O sites/kernels have also been removed to provide larger areas 110' which are added to the chip core area 140. Depending on the number of off-chip connections needed in the chip design of interest, the remainder of off-chip connections associated with some or all of the depopulated I/O sites/kernels could be removed to further increase the area added to the chip core area as shown in FIG. 5A. It should also be noted that this technique of increasing core area beyond depopulation of kernels is also applicable to other embodiments of the invention which will be discussed below in connection with FIGS. 6 and 7. Further, it should be recognized that while the kernels illustrated in FIGS. 4, 5 and 5A appear to each comprise two or four I/O sites in view of the illustrated power connections, kernels may be of any size or number of I/O cells, including a single I/O cell so long as power is provided to it through its own dedicated connections, independent of other kernels.

Figure 6:
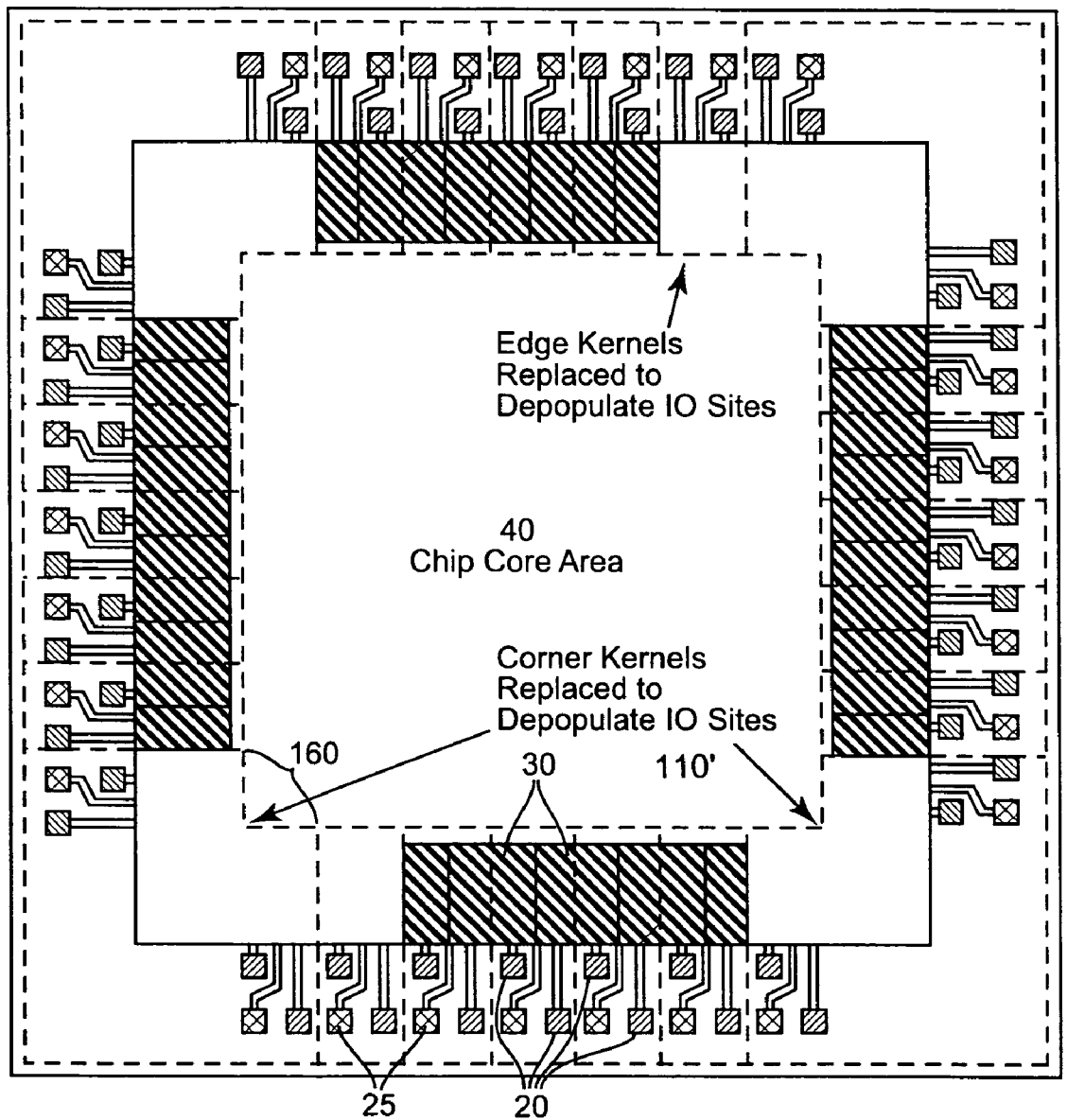

A further variant form of the invention is shown in FIG. 6. In this embodiment a plurality of contiguous corner and edge kernels are depopulated from the image and corresponding connection/wirebond pads are formed at the corners of the chip. This alternative provides increased area recovery but the recovered area is somewhat more difficult to use since layout of core cells in the recovered area will be facilitated by increased length of the boundary (e.g. 150 of FIG. 4) between the recovered area 110, 110' and the original core area 140. In other words, a shallow shape of the recovered area is more advantageous in terms of connecting cells in the recovered area to cells of the original core area. It can be seen from a comparison of the boundary length 150 of FIG. 4 with the much shorter boundary length 160 of FIG. 6 that connections will be much more restricted or crowded in the embodiment of FIG. 6. The same concern may limit the usability of recovered area in FIGS. 5 and 5A to some degree compared to significantly shallower recovered areas of FIG. 4 even though boundary lengths 150, 150' and 150" are the same since potentially more connections would be needed where the recovered area is further increased, particularly in depth.

It should also be noted that asymmetrical depopulation of I/O kernels is illustrated for generality in FIG. 6. While it is desirable to perform depopulation of I/O kernels in contiguous groups to keep the recovered area as shallow as possible, as explained above, the location and number of depopulated kernels is of no importance to the successful practice of the invention. However, it is considered preferable to maintain approximate radial symmetry of the I/O kernels as shown in FIG. 6 since such approximate radial symmetry will tend to simplify bonding to the package and tend to improve uniformity of heat transfer from the chip to the package and minimize stresses induced in the chip due to thermal cycling. It is also preferable for purposes of core cell layout to group I/O cell sites into an integral number of edge and corner kernels, preferably to coincide with arbitrary grid divisions, even if doing so results in a slight excess of I/O cells. That is, in general, it is preferred to perform I/O cell depopulation by I/O kernels, K having a number of I/O cells which is a integral multiple, m, of a particular number, n, of I/O cells so that M=m×n I/O cells remain even though N≦M I/O cells and off-chip connection pads are required. In this regard, while it is possible to do so, power is seldom brought into the core area of the chip through I/O cells since doing so is an inefficient use of chip space. However, by depopulating kernels having an integral number of signal pads and power pads, power can be brought into the chip through, for example, simple metal connection from pads remaining from depopulated kernels.

Figure 7:
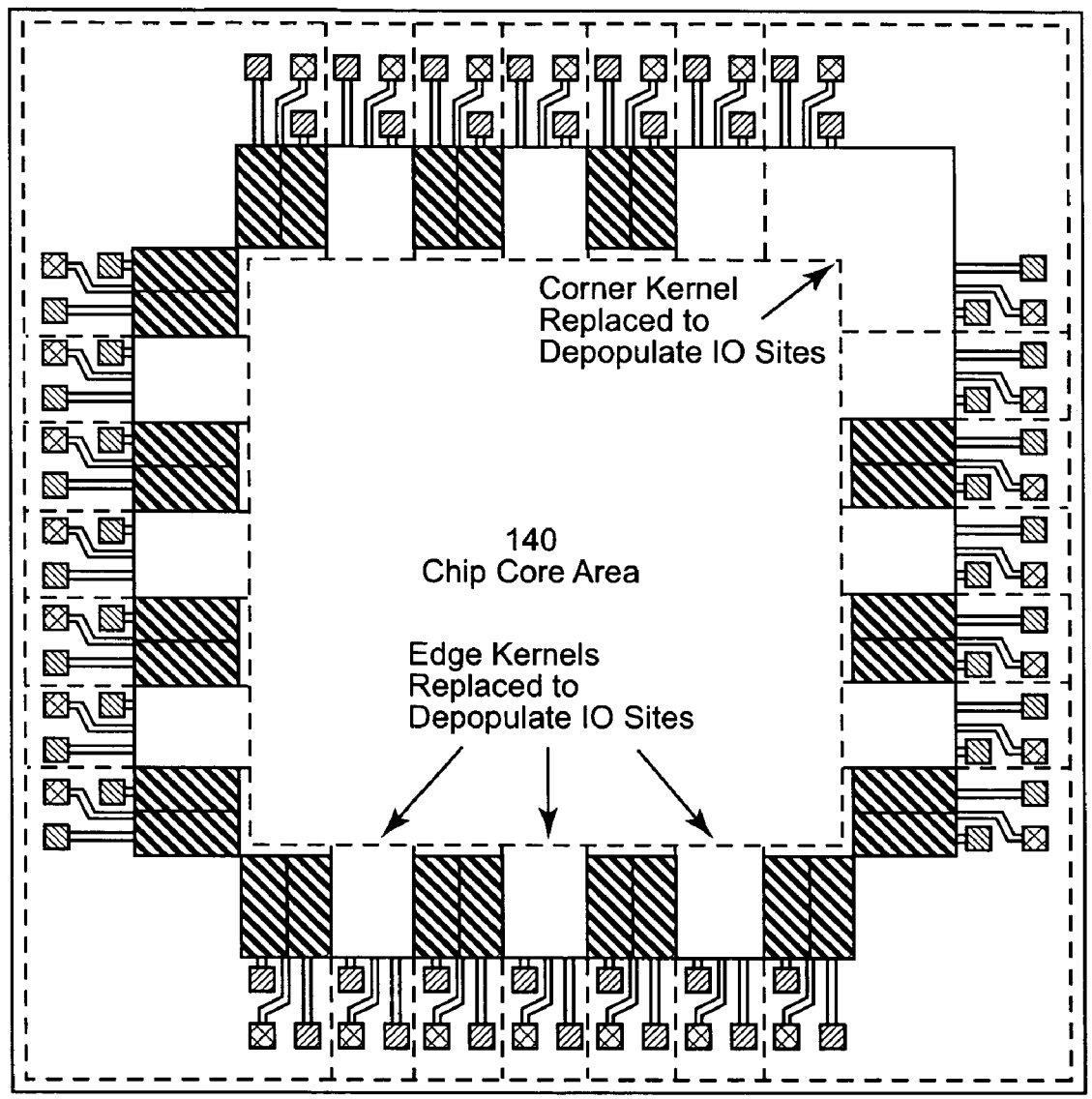

A third variant form of the invention is illustrated in FIG. 7. In this case, alternating edge I/O kernels between corner I/O kernels are depopulated. While this arrangement may seem superficially similar to the result of the technique described above in connection with FIG. 2, it differs significantly by removing kernels of I/O cell sites such that no power busses are present in the depopulated area, allowing the recovered area to be utilized in the same manner as the core area 140. Again, asymmetry of depopulation, including radial asymmetry, is illustrated. Note, in this regard, that only one corner kernel is depopulated. However, since the number of I/O kernels per chip edge do not differ significantly, it is likely that such a I/O kernel depopulation pattern would not cause problems in packaging or heat dissipation as described above, but evaluation of any such effect would depend on core cell layout. Also, the depopulated areas are not contiguous except adjacent the corner kernel (which would improve usability of the corner chip area as described above) and the usability of the remaining recovered area is not optimal although much more usable than the alternating cells of FIG. 2 if an I/O kernel includes at least two I/O cells. Therefore, this variant form of the invention is not preferred but may be advantageous in some circumstances.

That is, the areas added to the chip core area are, however, smaller than the areas added in accordance with the variant forms of the invention shown in FIGS. 5 and 6 and therefore place some constraints on placement of core cells and wireability. However, it should be recognized that the omitted edge I/O kernels may be located arbitrarily, if necessary, to accommodate large cells and connections thereto as well as to converted power connection pads. On the other hand, this variant form of the invention provides less concern in regard to package substrate design. This variant form of the invention also provides a more effective way to use I/O slots since any unwired I/O slot can be connected to a connection pad of an I/O site (SIO) of a depopulated kernel.

It should be clearly understood that the variant embodiments illustrated in FIGS. 5–7 and discussed above, are exemplary and intended to demonstrate how different advantages may be obtained through choice of the I/O kernels which are depopulated from the chip design and that many other resulting patterns of I/O kernels and added chip core area are possible and will be evident to those skilled in the art. It is also to be clearly understood that these variant embodiments and others are the possible alternative results of a method in accordance with the invention by which the chip size employed in the design may be substantially optimized as a function of the depopulation of I/O kernels from the chip. In other words, the principal advantage of the invention is the ability to fine tune the ratio of I/O cell site area to the internal logic or chip core area on a chip having peripheral I/O connections without a need for multiple aspect ratio I/O cell libraries and associated images.

More specifically, the invention provides two exemplary methodologies for optimizing chip size based on require I/O cell site numbers: one which does not consider constraints imposed by the chip package and a similar methodology which includes consideration of such constraints. These methods are illustrated in the flow charts of FIGS. 8 and 9, respectively. The preferred form of these methods is differentiated from a generalized form by some assumptions and simplifications as perfecting features but these preferred methods can be generalized as will be discussed below.

In the preferred embodiment of these methods, it is assumed that images are created from combinations of edge kernels and corner kernels and that depopulation is performed by removal of an integral number of edge and/or corner kernels of uniform size. In the generalized form of the invention, I/O cells could be depopulated individually (e.g. as a degenerate kernel having its own dedicated power connections) or in arbitrary groups. Further, the preferred implementation of the invention replaces the removed kernels with much smaller filler kernels as a computational and layout processing expedient but such replacement is not required in a generalized method in accordance with the invention.

The method requires, as design inputs or customer inputs, the total cell count required, referred to as "CELLS_required". This number should generally include factors such as area utilization, wireability, floor planning constraints and the like. Further, as design or supplier input, an image/package matrix (an exemplary form of which is illustrated in FIG. 10) is required with corresponding information for a given die size of an image fully populated with I/O cells and including the total number of SIOs, the total cell count, the number of edge kernels and the corner kernel type. An exemplary image/package matrix is provided as FIG. 10. It should be noted that this image/package matrix is a small subset of data library content of basic chip images.

Figure 8:
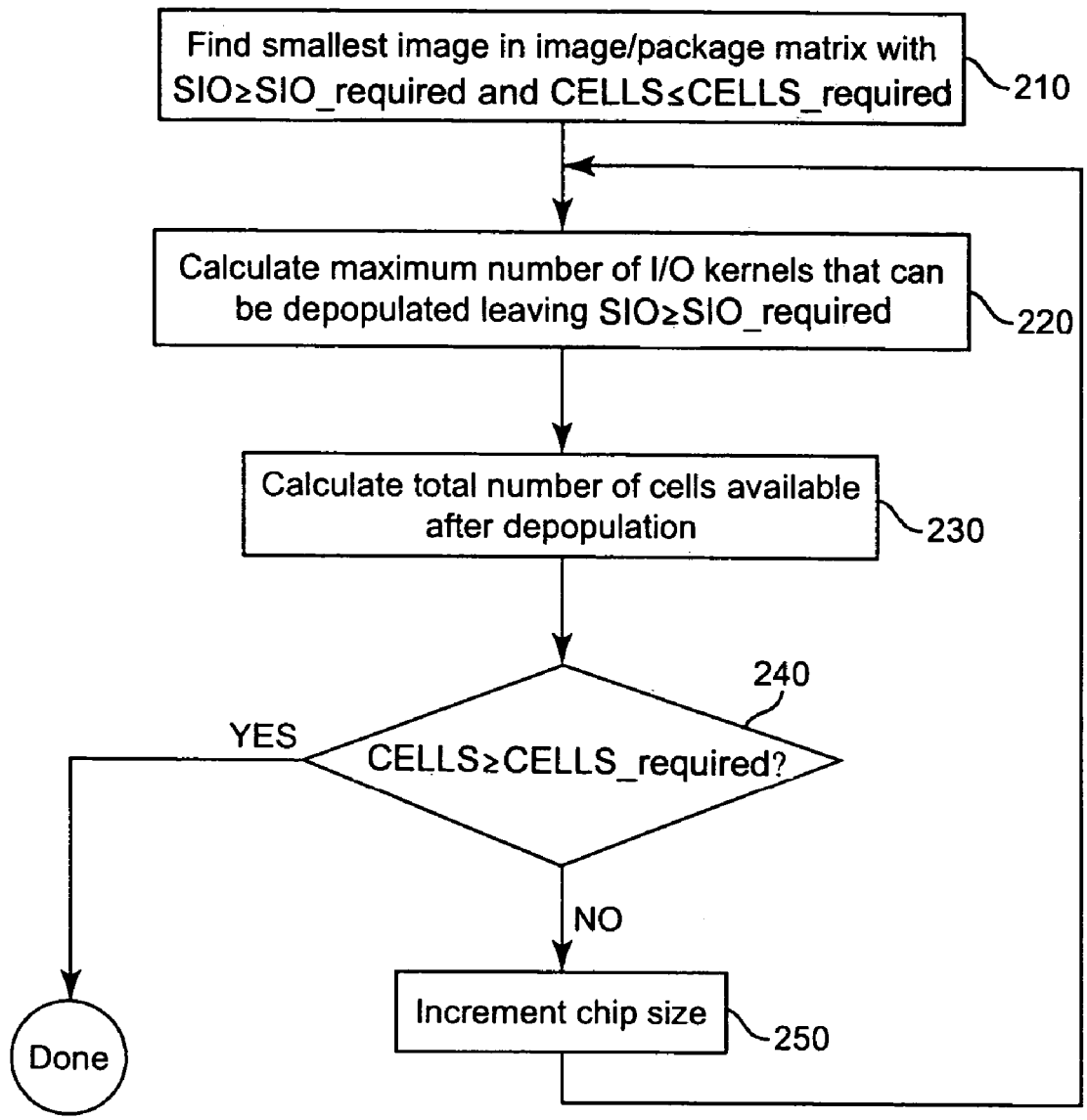
FIG. 8 is a flow chart illustrating a first embodiment of the invention which is independent of package constraints.

First, as shown in FIG. 8, the image/package matrix is scanned to find the smallest image with SIO≧SIO_required (210). It is important to an understanding of the invention that this criterion assures that the number of I/O cells available in the image is sufficient for the design (e.g. to provide for communication of required signals on and off the chip) but does not consider whether or not sufficient logic for performing the desired processing functions can be accommodated on the chip at this point in the process (since the core logic area will be increased by removal of unneeded I/O cells). For this image, the number of image edge kernels is found (e.g. retrieved from a data library for the image) for the chosen chip image (220). Then, as shown at 230, M, the maximum number of edge and/or corner kernels (or individual I/O cells) that can be removed consistent with SIO≧SIO_required is calculated. Accordingly, the additional area that can be made available in the core area by depopulating I/O cells or kernels can be projected and the total number of cells which are thus available is calculated (240). Alternatively, a conversion of M I/O kernels to a number of logic or other types of cells can be performed and added to the number of cells available in accordance with the image. Other calculations will be apparent to those skilled in the art and the particular method of calculating the number of cells available is, in any case, not critical to the practice of the invention.

It is then determined if CELLS≧CELLS_required and if so, an optimal solution and minimum chip size has been determined (at least from among the chip images available) and the process is complete. If not, the die size is incremented (250) to the next larger die size and the process is repeated until CELLS≧CELLS_required, providing an optimal chip size for the design.

Thus, in summary, the process begins with selecting the smallest chip image that can supply at least the required number of I/O cells, determining the number, M, of excess cells or kernels (edge or corner) that can be depopulated consistent with the required number of I/O cells, computing the number of other cells types which can be provided by the core area of the image and the area of the M depopulated I/O cells or kernels and determining from that result if the required number of cells for the design can be provided within the image if M I/O cells or I/O kernels are depopulated. Thus, the chip image of minimum adequate size is determined prior to any design layout work being performed and, for that reason and the impracticality of determining a minimum chip size for a substantially completed design (which is logically circular since the design is largely performed by a process which accommodates chip size constraints depending of the chip image chosen) provides not only a design at an optimally minimal chip image size, which has not previously been possible, but also provides substantial economic benefits, particularly in regard to chip space utilization, compared with known methods of depopulating unusable I/O cell sites which impose severe layout constraints through requiring a more-or-less rigid specification of the number and location of I/O cell sites to be depopulated, often leading to selection of a much larger chip image size than necessary (since known methods seek to reduce the number of I/O sites by about one-half) while foreclosing practical optimization of chip size and then only through a more complicated methodology.

An alternative embodiment of the invention additionally provides consideration of both chip and package constraints. Essentially, it is identical to the process described above except for starting with additional package information and providing an addition final compatibility check of the resulting image with the chosen package, as will be evident from a comparison of FIG. 9 with FIG. 8, described above. This alternative embodiment is also described in accordance with a preferred embodiment thereof buy can also be generalized in the same manner as described above.

Figure 9:
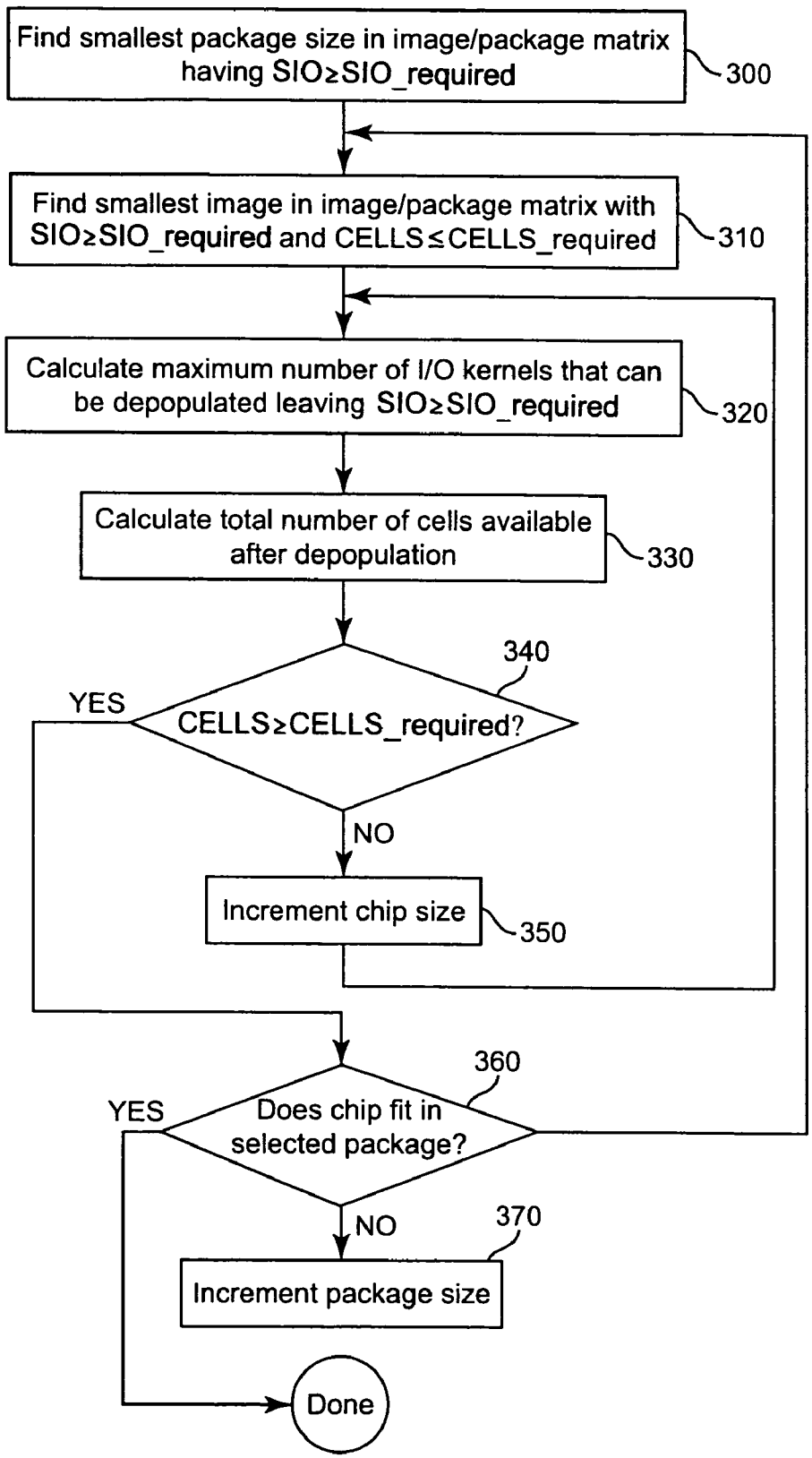
FIG. 9 is a flow chart illustrating a second embodiment of the invention which includes consideration of package constraints.

Initially, as illustrated in FIG. 9, a search 300 is made of the package/matrix libraries for the smallest package which can provide SIO≧SIO_required. Then, the image/package matrix is scanned to find the smallest image with SIO≧SIO_required (310). For this image, the number of image edge kernels is found (e.g. retrieved from a data library for the image) for the chosen chip image (320). Then, as shown at 330, M, the maximum number of edge and/or corner kernels (or individual I/O cells) that can be removed consistent with SIO≧SIO_required is calculated. Accordingly, the additional area that can be made available in the core area by depopulating I/O cells or kernels can be projected and the total number of cells which are thus available is calculated (340). Alternatively, a conversion of M I/O kernels to a number of logic or other types of cells can be performed and added to the number of cells available in accordance with the image. Other calculations will be apparent to those skilled in the art and the particular method of calculating the number of cells available is, in any case, not critical to the practice of the invention.

It is then determined if CELLS≧CELLS_required and if so, an optimal solution and minimum chip size has been determined (at least from among the chip images available) and the process is complete. If not, the die size is incremented (350) to the next larger die size and the process is repeated until CELLS≧CELLS_required, providing an optimal chip size for the design. When this process has been completed, it is determined (360) if the die/chip size of the resulting image will still fit in the package originally selected. If so, the process is complete. If not, the package size is incremented 370 and the process resumed with selection of an image usable with the new package capable of providing the needed number of I/O cells. This selection may be the same as the current result but compatibility of the resulting chip may not be compatible with the new, larger package size or vice-versa as indicated by data in the image/package matrix library and the repetition of image selection essentially implements a compatibility check and assures that the eventual result includes a compatible image and package. For example, it may well be that a larger than optimal chip must be used for the design in order to be compatible with an existing and supported package due to cavity size, chip support, pinout arrangements and/or the like.

In view of the foregoing, it is seen that the invention provides optimization of chip size and package for a given amount of desired functionality of an non-I/O limited integrated circuit prior to development of any portion of the chip layout in the chip core area. The invention further provides increased freedom from layout constraints and improved chip area usage with a methodology with is substantially simpler than prior approaches to improving chip area usage that preclude practical optimization of chip size as provided by the invention.

While the invention has been described in terms of a single preferred embodiment, those skilled in the art will recognize that the invention can be practiced with modification within the spirit and scope of the appended claims.

What is claimed is:

1. A method for developing a design of an integrated circuit, said method comprising steps of
   selecting a smallest chip image from among a plurality of chip images that can supply at least a required number of I/O cells,
   determining a number of excess I/O kernels of said smallest chip image in excess of said required number of I/O cells,
   computing a number of other cells types which can be provided by the core area of the image and the area of the excess I/O kernels, and
   evaluating from a result of said computing step if a required number of cells for said integrated circuit design can be provided within said smallest chip image if said excess I/O cells or I/O kernels are depopulated from said smallest chip image.

2. A method as recited in claim 1, wherein, if the required number of cells for said integrated circuit design can not be provided, said method includes the further step of selecting a next larger chip size and repeating said determining computing and evaluating steps.

3. A method as recited in claim 2, including the further step of selecting a smallest package size providing said required number of I/O cells and said step of selecting a smallest chip image is performed by selection from chip images corresponding to said smallest package size.

4. A method as recited in claim 3, including the further step of determining, when a said larger chip size can provide said required number of cells, performing the further step of determining if said larger chip size can be accommodated by said package and, if not, selecting a larger package size.

5. A method as recited in claim 1, including the further step of selecting a smallest package size providing said required number of I/O cells and said step of selecting a smallest chip image is performed by selection from chip images corresponding to said smallest package size.

6. An integrated circuit including
   an array of I/O kernels, each I/O kernel having a plurality of contiguous I/O cells having off-chip connections sites, said off-chip connection sites including common power connections for all I/O cells in an I/O kernel, said common power connections for an I/O kernel being independent of any other I/O kernel,
   a plurality of contiguous depopulated I/O cell sites corresponding to an area of a said I/O kernel in a standard pattern of I/O cells and having core cells formed therein, said depopulated I/O cell sites having off-chip connection sites corresponding to some off-chip connection sites of said I/O cells.

7. An integrated circuit as recited in claim 6, further including some off-chip connection pads corresponding to I/O cells in said depopulated I/O cell sites.

8. An integrated circuit as recited in claim 7, further including all off-chip connection pads corresponding to I/O cells in said depopulated I/O cell sites.

9. An integrated circuit as recited in claim 6, wherein said I/O kernels are arranged with substantially radial symmetry along edges of a semiconductor chip.

10. An integrated circuit as recited in claim 6, wherein said plurality of contiguous depopulated I/O cell sites correspond to an area of a said I/O kernel including a corner kernel.

11. An integrated circuit as recited in claim 6, wherein said plurality of contiguous depopulated I/O cell sites correspond to an area of a said I/O kernel including an edge kernel.

12. An integrated circuit as recited in claim 6, including at least two pluralities of contiguous depopulated I/O cell sites corresponding to an area of a said I/O kernel on a single edge of a chip, said two pluralities of contiguous depopulated I/O cell sites being separated by an I/O kernel.

13. An integrated circuit as recited in claim 6, further including
   a metal power connection through a said depopulated I/O cell site.

14. An integrated circuit having peripheral connections pads including
   I/O cells associated with a contiguous plurality of said connection pads in a standard pattern of I/O cells and a plurality of contiguous depopulated I/O cell sites associated with a contiguous plurality of other said connection pads, said depopulated I/O cells sites corresponding to areas in said standard pattern from which I/O cells have been depopulated, and
   power connections connecting said other connection pads and logic cells located in said depopulated I/O cell sites.

* * * * *